(12) United States Patent
Moreno Levy (10) Patent No.: US 11,816,525 B2
(45) Date of Patent: Nov. 14, 2023

(54) METHOD FOR WIRELESSLY RECEIVING AND TRANSMITTING ELECTROMAGNETIC RADIATION, AND ELECTRONIC DEVICE THEREFOR

(71) Applicant: YOCTO TECHNOLOGIES, S.L., Madrid (ES)

(72) Inventor: Danny Moreno Levy, Madrid (ES)

(73) Assignee: YOCTO TECHNOLOGIES, S.L., Madrid (ES)

( * ) Notice: Subject to any disclaimer, the term of this patent is extended or adjusted under 35 U.S.C. 154(b) by 0 days.

(21) Appl. No.: 17/719,003

(22) Filed: Apr. 12, 2022

(65) Prior Publication Data

US 2022/0335234 A1    Oct. 20, 2022

(51) Int. Cl.
| | | |
|---|---|---|
| G06K 7/10 | (2006.01) | |
| H02J 50/20 | (2016.01) | |
| H02J 7/00 | (2006.01) | |
| G01R 29/08 | (2006.01) | |

(52) U.S. Cl.
CPC .......... G06K 7/10366 (2013.01); H02J 7/007 (2013.01); H02J 50/20 (2016.02); G01R 29/0892 (2013.01)

(58) Field of Classification Search
CPC ....... G06K 7/10366; H02J 7/007; H02J 50/20
USPC ................ 235/451, 472.01–472.3
See application file for complete search history.

(56) References Cited

U.S. PATENT DOCUMENTS

| | | | |
|---|---|---|---|
| 2008/0055092 A1 | 3/2008 | Burr | |
| 2015/0042456 A1* | 2/2015 | Huang | G06K 19/0717 340/10.1 |
| 2016/0155040 A1 | 6/2016 | Patterson et al. | |
| 2021/0174282 A1 | 6/2021 | Moreno Levy | |

\* cited by examiner

*Primary Examiner* — Jamara A Franklin
(74) *Attorney, Agent, or Firm* — BROOKS KUSHMAN PC; John E. Nemazi (57) ABSTRACT

A method for wirelessly receiving and transmitting electromagnetic radiation and to an electronic device thereof, the method including the steps of, wirelessly receiving a first electromagnetic radiation, and storing energy of the received first electromagnetic radiation in an energy storage. Determining, from the amount of energy stored, whether energy stored in the energy storage should be provided to a demodulator and a comparator and/or to a modulator and a transmitter such that they are switched. Demodulating the second electromagnetic radiation so that a first signal is generated. Comparing the first signal with a set of signals. Wirelessly receiving a third electromagnetic radiation. Modulating the third electromagnetic radiation into a fourth electromagnetic radiation by using two different modulations, thereby modifying data contained in the third electromagnetic radiation, and wirelessly transmitting the fourth electromagnetic radiation.

16 Claims, 7 Drawing Sheets

METHOD FOR WIRELESSLY RECEIVING AND TRANSMITTING ELECTROMAGNETIC RADIATION, AND ELECTRONIC DEVICE THEREFOR

CROSS-REFERENCE TO RELATED APPLICATIONS

This application claims foreign priority benefits under 35 U.S.C. § 119(a)-(d) to EP21382314 application filed Apr. 14, 2021, the disclosure of which is hereby incorporated in its entirety by reference herein.

TECHNICAL FIELD

The present invention relates in general to the field of methods for wirelessly receiving and transmitting electromagnetic radiation.

BACKGROUND

The owner of the present patent application is the owner of Spanish patent application with number 201800092 filed on 13 Apr. 2018 (PCT/M2019/050516) which disclosed a communication system which has been improved as explained and particularized in the present patent application.

Passive and active electronic tags are known in the art. Active electronic tags comprise a battery which provides the tag with the energy required for the tag to work. The use of a battery has the following disadvantages among others. Batteries able to store the relatively high amount of energy required by active electronic tags are expensive, increase size and weight of the electronic tag, cannot be used in harsh environments, generate undesirable noise in transmissions and have a high environmental impact. In addition, the batteries lose effectiveness over time, negatively affecting the transmission of information from the tag, hence decreasing reliability of the transmission of information.

Passive electronic tags, unlike active electronic tags, do not require a battery or are able to work with a battery of lower capacity of energy storage than that of active tags. Passive electronic tags rely on supply of energy from a source external to the electronic tag. Known passive electronic tags require a very specific external source of energy, which is not readily available in most places. In addition, the energy supply to passive electronic tags is limited, hence limiting in a high degree the processing tasks that the tag can perform and limiting the communication range of the tag. In addition, known passive electronic tags cannot successfully rely on energy from electromagnetic radiation having a frequency of 2.45 GHz or higher for obtaining the energy required to work. Known electronic tags operating on 2.45 Ghz are active.

Therefore, there is a need for an electronic tag which overcomes the aforementioned limitations of known active and passive electronic tags.

In addition, electronic devices which operate with electromagnetic radiation having a frequency of 2.45 GHz are known in the art. However, these devices require establishment of a connection before exchanging data with them. In addition, these devices require an IP and require checking whether data is expected to be received before sending their own data.

US2016/155040A1 discloses a passive RFID tag with an integrated circuit using sub-threshold technology.

SUMMARY

In order to overcome the drawbacks of the state of the art, the present invention proposes a method for receiving and transmitting electromagnetic radiation, and also a corresponding device therefor, which can be implemented as a tag (such as a passive smart tag), and which does not need any dedicated readers for its operation.

A first aspect of the invention relates to a method for wirelessly receiving and transmitting electromagnetic radiation, the method comprising:
  wirelessly receiving a first electromagnetic radiation;
  storing energy of the received first electromagnetic radiation in an energy storage;
  determining whether a parameter indicative of the energy stored in the energy storage indicates that the energy stored in the energy storage is higher than a first predefined value or lower than a second predefined value, wherein the second predefined value is lower or equal to the first predefined value;
  if the parameter indicates that the energy stored in the energy storage is higher than the first predefined value, supplying energy from the energy storage:
    to a demodulator and a comparator such that the demodulator and the comparator are in a switch on state, and/or
    to a modulator and a transmitter such that the modulator and the transmitter are in a switch on state;
  if the parameter indicates that the energy stored in the energy storage is lower than the second predefined value, limiting the supply of energy from the energy storage to the demodulator and the modulator such that the demodulator and the modulator are in a switch off state;
  wirelessly receiving a second electromagnetic radiation;
  if the demodulator is in a switch on state, demodulating the second electromagnetic radiation so that a first signal is generated, wherein the demodulating step is performed by the demodulator;
  if the comparator is in a switch on state, comparing the first signal with a set of signals, wherein the comparing step is performed by the comparator;
  wirelessly receiving a third electromagnetic radiation;
  if the modulator is in a switch on state, modulating the received third electromagnetic radiation into a fourth electromagnetic radiation if the first signal matches a signal of the set of signals; wherein the modulating step is performed by the modulator and comprises:
  modulating a first portion of the third electromagnetic radiation into the fourth electromagnetic radiation using a first modulation;
  modulating a second portion of the third electromagnetic radiation into the fourth electromagnetic radiation using a second modulation different from the first modulation, thereby modifying data contained in the second portion of the third electromagnetic radiation;
  if the transmitter is in a switch on state, wirelessly transmitting the fourth electromagnetic radiation, wherein the wireless transmitting step is performed by the transmitter.

The method allows activating, i.e. supplying the energy required for working to, the components, of for example a passive electronic tag, via reception and storage of energy from electromagnetic radiation. The method enables the performance of operations of storing data, reading data, processing data, writing data and transmitting data in a long range by merely using energy obtained from the first electromagnetic radiation. Hence the method allows dispensing with the need for batteries with a relatively high capacity of energy storage required by known active tags for performing the same operations. In addition, the first electromagnetic radiation need not be specific since the method can be implemented with electromagnetic radiations of a broad range of frequencies and power.

The parameter indicative of the energy stored in the energy storage may be any parameter known by the skilled person, such as voltage or current of the energy storage.

The step of determining whether the energy stored in the energy storage is higher than a first predefined value allows a reliable supply of a relatively high energy required by the demodulator and the comparator and by the modulator and the transmitter for performing the method steps even if the stored energy is exclusively obtained from a first wireless electromagnetic radiation having a relatively high frequency, such as ultra high frequency (UHF) and more particularly a frequency higher than 2.45 GHz. Energy is not taken from the energy storage until the energy storage has enough energy for performing the method steps. Preventing in this way the supply of energy from the energy storage when the energy storage does not have the energy required to perform the method, which would unduly discharge the energy storage since the energy would not allow performance of the method. Thereby, the energy required by the demodulator and the comparator for respectively demodulating electromagnetic radiation and comparing signals, and the energy required by the modulator and the transmitter for respectively modulating and transmitting electromagnetic radiation can be wirelessly obtained from a first wireless electromagnetic radiation having a relatively high frequency. In some embodiments, both the first predefined value and the second predefined value indicate that the energy stored in the energy storage is higher than zero.

In some embodiments the energy storage is a capacitor.

In some embodiments the first predefined value is the same as the second predefined value. In other embodiments the second predefined value is lower than the first predefined value.

The step of comparing the first signal with a set of signals allows determining which instruction to execute, such as inserting data from a data storage in an electromagnetic radiation or transmitting an ID or other specific data The second portion of the third electromagnetic radiation may be identified using any method known by the skilled person. For example, a counter may be triggered upon reception of the third electromagnetic radiation, whereby reaching the end of a count of the counter means that the second portion of the third electromagnetic radiation is starting to be received. Other examples are known methods for measuring time from reception of the third electromagnetic radiation, such as keeping track of a voltage of an electronic component such as a capacitor which voltage depends, for example, on the amount of clock pulses received by the capacitor.

In the present disclosure, the term "first" in the context of the expression "first portion of the third electromagnetic radiation" does not necessarily mean that the "first portion of the third electromagnetic radiation" is previous to the "second portion of the third electromagnetic radiation", although in some embodiments it does.

In some embodiments, limiting the supply of energy from the energy storage to the demodulator and the modulator such that the demodulator and the modulator are in a switch off state means not supplying of energy from the energy storage to the demodulator and the modulator.

In some embodiments, the transmitter forms part of the modulator.

In some embodiments, the first modulation of the first portion of the third electromagnetic radiation is performed with a first signal and the second modulation of the second portion of the third electromagnetic radiation is performed with a second signal different from the first signal.

In some embodiments, the second portion of the third electromagnetic radiation is determined by using the matched signal and/or a parameter of the second modulation depends on the matched signal. In this way, the particular portion of the third electromagnetic radiation which data is modified by modulation with the second modulation and/or the data inserted through the modulation with the second modulation may be controlled by causing reception of a second electromagnetic radiation which matches a particular signal of the set of signals.

In some embodiments, the first electromagnetic radiation has a frequency of 2.45 GHz or higher. In this way, energy supplied to the monitoring module is obtained from electromagnetic radiation having a frequency of 2.45 or higher.

In some embodiments, the first electromagnetic radiation has a frequency of 2.45 GHz or lower. This allows increasing energy obtained from the first electromagnetic radiation because an electromagnetic radiation having a lower frequency is subjected to lower attenuation.

In some embodiments, the first electromagnetic radiation is a packet of protocol IEEE 802. Thereby, packets of protocol IEEE 802 are captured for charging the energy storage.

In some embodiments, the first and second predefined values of the parameter indicative of the energy stored in the energy storage are of at least 0.92 Volts "unit Y" and of at most 1.15 Volts "unit V".

In some embodiments, energy from the energy storage is supplied to the demodulator, the comparator, the modulator and/or the transmitter via one or more clocks. In some of these embodiments, the supply of energy from the energy storage to the demodulator, the comparator, the modulator and/or the transmitter is limited by limiting the supply of energy from the energy storage to the one or more clocks.

In some embodiments, the demodulating step is performed at a first clock rate, and the modulating step is performed at a second clock rate; wherein the first clock rate is lower than the second clock rate. In this way, energy is saved in comparison to embodiments in which the demodulation of the second electromagnetic radiation and the modulating step are performed at the second clock rate. In addition, the modulation of the third electromagnetic radiation is enhanced in comparison to embodiments in which the demodulation of the second electromagnetic radiation and the modulating step are performed at the first clock rate.

In some embodiments, the modulation causes a change in the frequency of the radiation, thereby minimizing overlap of frequencies between the third and the fourth electromagnetic radiation and hence allowing simultaneous reception of the third electromagnetic radiation and transmission of the fourth electromagnetic radiation.

In some embodiments, the third electromagnetic radiation is a packet of protocol IEEE 802. Thereby, data of the second portion of the packet is modified through the modulation with the second modulation. In some of these embodiments, the third electromagnetic radiation is a packet of protocol IEEE 802 having a header and a payload; wherein the header forms part of the first portion of the third electromagnetic radiation, and the payload forms part of the second portion of the third electromagnetic radiation.

In some embodiments, the step of demodulating the second electromagnetic radiation is performed only if the power of the second electromagnetic radiation is higher than a third predefined value.

In some embodiments, the third predefined value is adjustable within a range of at least −40 dBm and at most −10 dBm.

In some embodiments, the third electromagnetic radiation is modulated into the fourth electromagnetic radiation by adjusting a reflection, for example backscattering, of the third electromagnetic radiation. In particular, this may be achieved by adjusting a reflection coefficient. In this manner, the phase, amplitude and/or frequency of the fourth electromagnetic radiation, and hence the data contained in the fourth electromagnetic radiation, may be adjusted by adjusting the reflection of the third electromagnetic radiation.

In some embodiments, the reflection of the third electromagnetic radiation is adjusted by adjusting an impedance of a wireless receiver performing the step of wirelessly receiving the third electromagnetic radiation. Thereby, by adjusting the impedance of the wireless receiver it is adjusted the degree to which the third electromagnetic radiation is reflected by the wireless receiver. Therefore, by adjusting the impedance of the wireless receiver differently, the method allows implementing a second modulation which is different from the first modulation to the second portion of the third electromagnetic radiation. In this way, the method allows generating a fourth electromagnetic radiation by precisely replacing original data contained in the third electromagnetic radiation with data contained in a data storage without changing other original data of the third electromagnetic radiation.

In some embodiments, the wireless receiver performing the step of wirelessly receiving the third electromagnetic radiation is the transmitter performing the step of wirelessly transmitting the fourth electromagnetic radiation. In this way, it is not required to transmit the third electromagnetic radiation from the wireless receiver to a wireless transmitter separate from the wireless receiver. Thereby, it is dispensed with the need to provide energy for transmission between the wireless receiver and the separate wireless transmitter and hence energy consumption is minimized.

In some embodiments:
if the parameter indicative of the energy stored in the energy storage indicates that the energy stored in the energy storage is higher than the first predefined value and the first signal matches a signal of the set of signals, supplying energy from the energy storage to the modulator and the transmitter such that the modulator and the transmitter are in a switch on state, and limiting supply of energy from the energy storage to the comparator such that the comparator is in a switch off state;
if the parameter indicative of the energy stored in the energy storage indicates that the energy stored in the energy storage is higher than the first predefined value and the first signal does not match any signal of the set of signals, supplying energy from the energy storage to the demodulator and the comparator such that the demodulator and the comparator are in a switch on state, and limiting supply of energy from the energy storage to the modulator and/or the transmitter such that the modulator and/or the transmitter is/are in a switch off state. In these embodiments, energy consumption is further decreased because energy is not supplied from the energy storage to the modulator and the transmitter when not any second electromagnetic radiation has been received or when the first signal does not match any signal of the set of signals. Energy is supplied to the modulator and to the transmitter after a first signal matches a signal of the set of signals i.e. upon receiving an instruction. In some of these embodiments, supply of energy from the energy storage to the modulator and to the transmitter is stopped after executing the instruction(s) contained in the first signal. In addition, energy consumption is further decreased in these embodiments because supply of energy from the energy storage to the comparator is stopped after the first signal matches a signal from the set of signals. In some of these embodiments, energy is supplied to the demodulator and the comparator after the instructions contained in the first signal are executed.

A second aspect of the invention relates to an electronic device for wirelessly receiving and transmitting electromagnetic radiation, the electronic device comprising:
a receiver for receiving a first electromagnetic radiation;
an energy storage configured for storing energy of the received first electromagnetic radiation;
a demodulator configured for demodulating a second electromagnetic radiation wirelessly received by the electronic device so that a first signal is generated;
a comparator configured for comparing the first signal with a set of signals;
a measuring entity configured for defining a second portion of a third electromagnetic radiation wirelessly received;
a modulator;
a transmitter for transmitting a fourth electromagnetic radiation;
a data storage; and
energy supply means configured for supplying energy from the energy storage:
to the demodulator and the comparator such that the demodulator and the comparator are in a switch on state, and/or
to the modulator and the transmitter such that the modulator and the transmitter are in a switch on state
if a parameter indicative of the energy stored in the energy storage indicates that the energy stored in the energy storage is higher than a first predefined value;
the energy supply means being further configured for: if the parameter indicates that the energy stored in the energy storage is lower than a second predefined value lower or equal to the first predefined value, limiting the supply of energy from the energy storage to the demodulator and the modulator such that the demodulator and the modulator are in a switch off state;
the demodulator being configured for demodulating the second electromagnetic radiation if the demodulator is in a switch on state;
the comparator being configured for comparing the first signal with a set of signals if the comparator is in a switch on state;
the modulator being configured for modulating the received third electromagnetic radiation into the fourth electromagnetic radiation if the first signal matches a signal of the set of signals and the modulator is in a switch on state; wherein the modulator is configured for performing the modulation by:
modulating a first portion of the third electromagnetic radiation into the fourth electromagnetic radiation using a first modulation, and
modulating the second portion of the third electromagnetic radiation into the fourth electromagnetic radiation using a second modulation different from the first modulation, thereby modifying data contained in the second portion of the third electromagnetic radiation.

In some embodiments, the receiver for receiving a first electromagnetic radiation is also the transmitter for transmitting a fourth electromagnetic radiation and/or the receiver for receiving the second and/or third electromagnetic radiation, for example is the same antenna.

The electronic device of the second aspect of the invention can be implemented as an electronic tag, such as an electronic passive tag.

A third aspect of the invention relates to an electronic device comprising:
- a wireless transceiver for receiving and transmitting electromagnetic radiations;
- an energy storage for storing energy of a received electromagnetic radiation;
- a data storage; and
- processing means for carrying out the method of the first aspect of the invention.

The electronic device of the third aspect of the invention can be implemented as an electronic tag, such as an electronic passive tag.

Although at least part of the present disclosure mentions a demodulator, a comparator, a modulator and a transmitter as different entities, it is not required that these entities are independent. It is well known by the skilled person that the same electronic device, e.g. processing means, can be used as part of a demodulator, comparator, modulator and transmitter by appropriate configuration of the electronic device and hence the configuration of the electronic device at a particular moment is what provides information on whether the electronic device forms part of the demodulator, the comparator, the modulator and/or the transmitter.

The different aspects and embodiments of the invention defined in the foregoing can be combined with one another, as long as they are compatible with each other.

Additional advantages and features of the invention will become apparent from the detailed description that follows and will be particularly pointed out in the appended claims.

BRIEF DESCRIPTION OF THE DRAWINGS

To complete the description and in order to provide a better understanding of the invention, a set of drawings is provided. Said drawings form an integral part of the description and illustrate embodiments of the invention, which should not be interpreted as restricting the scope of the invention, but just as an example of how the invention can be carried out. The drawings comprise the following figures.

DETAILED DESCRIPTION OF EMBODIMENTS

The following description is not to be taken in a limiting sense but is given solely for the purpose of describing the broad principles of the invention. Embodiments of the invention will be described by way of example, with reference to the above-mentioned drawings.

Figure 1A:
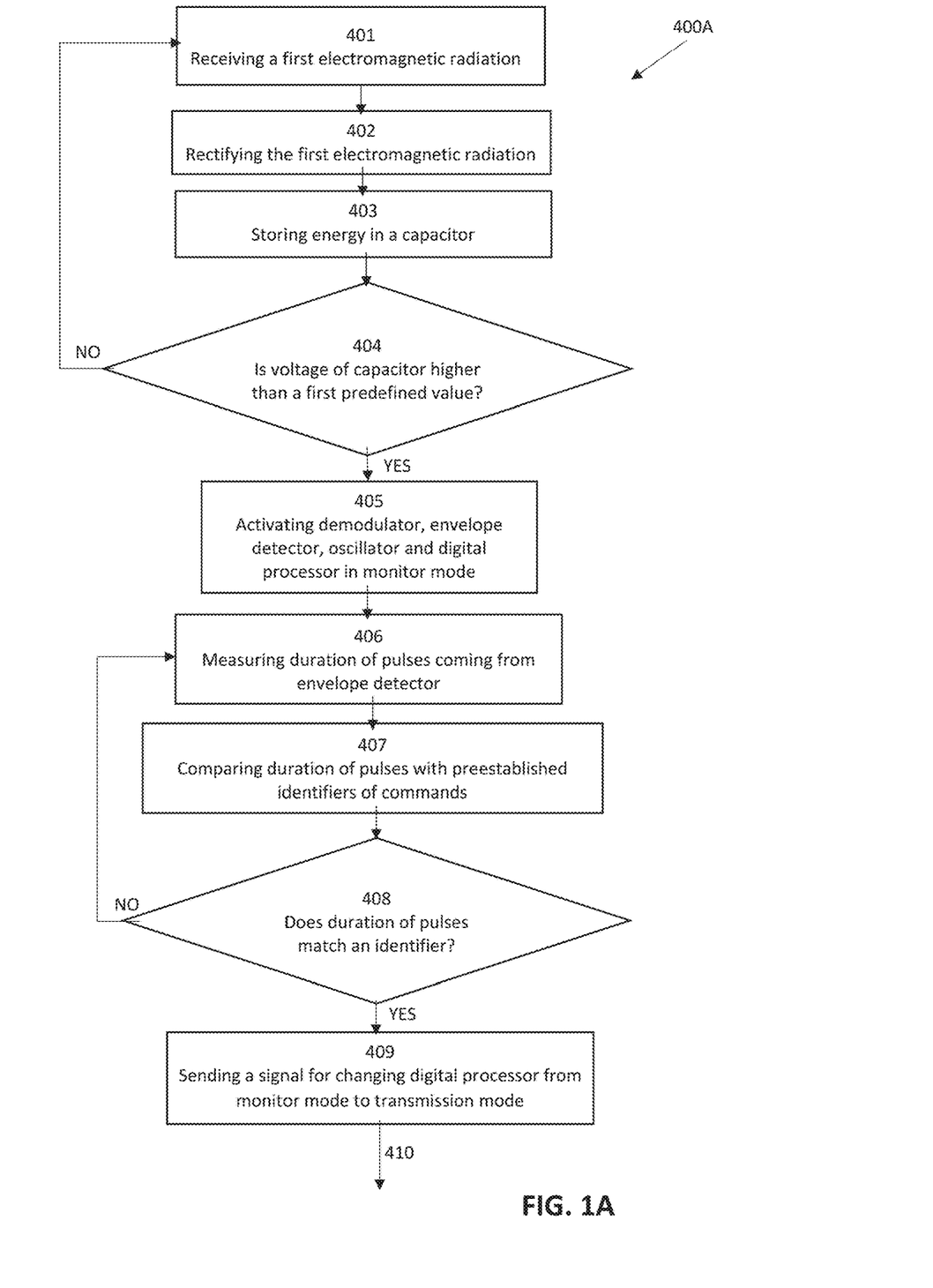
FIG. 1A is a diagram of a first part of an embodiment of a method according to the present invention.
Figure 1B:
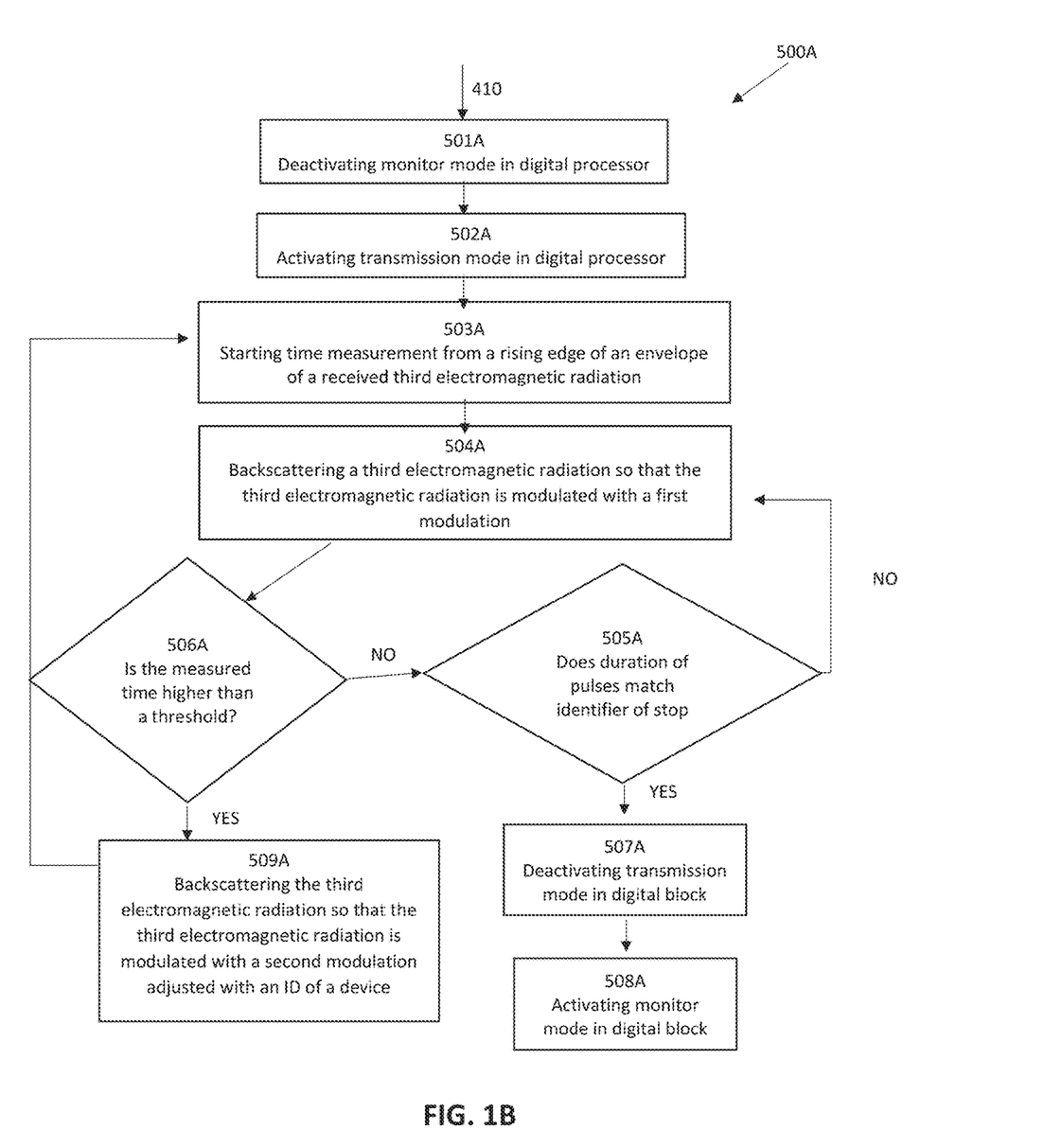
FIG. 1B is a diagram of a second part of a method according to the present invention.
Figure 1C:
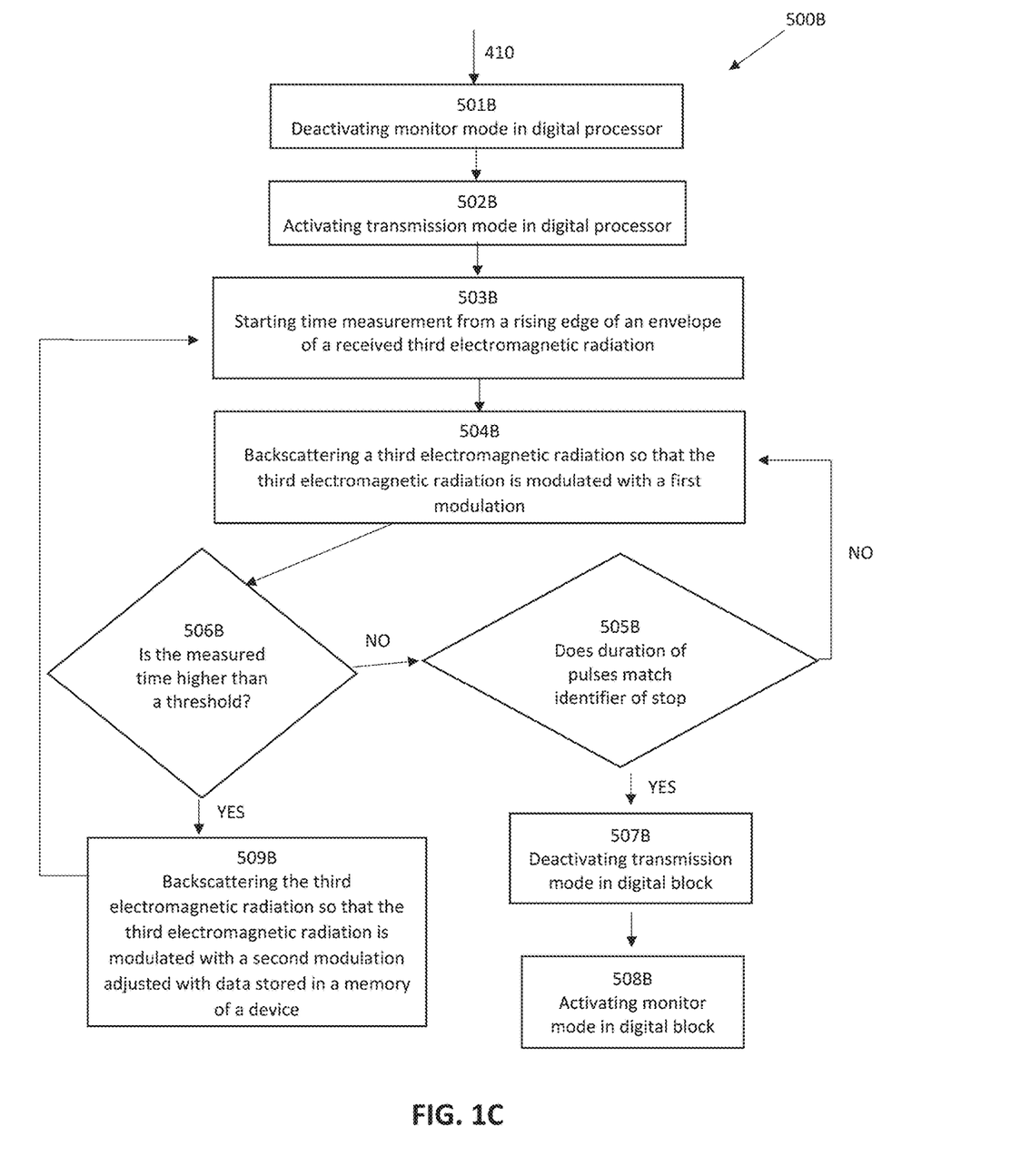
FIG. 1C is a diagram of a second part of a method according to the present invention.
Figure 3:
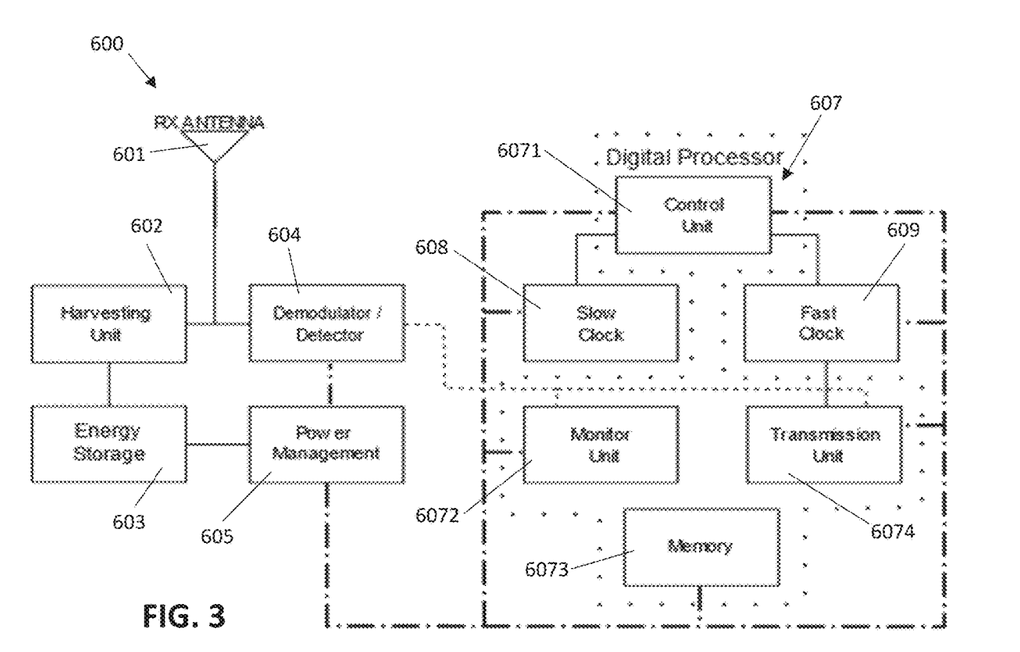
FIG. 3 schematically illustrates components of an electronic device according to the present invention.
Figure 4:
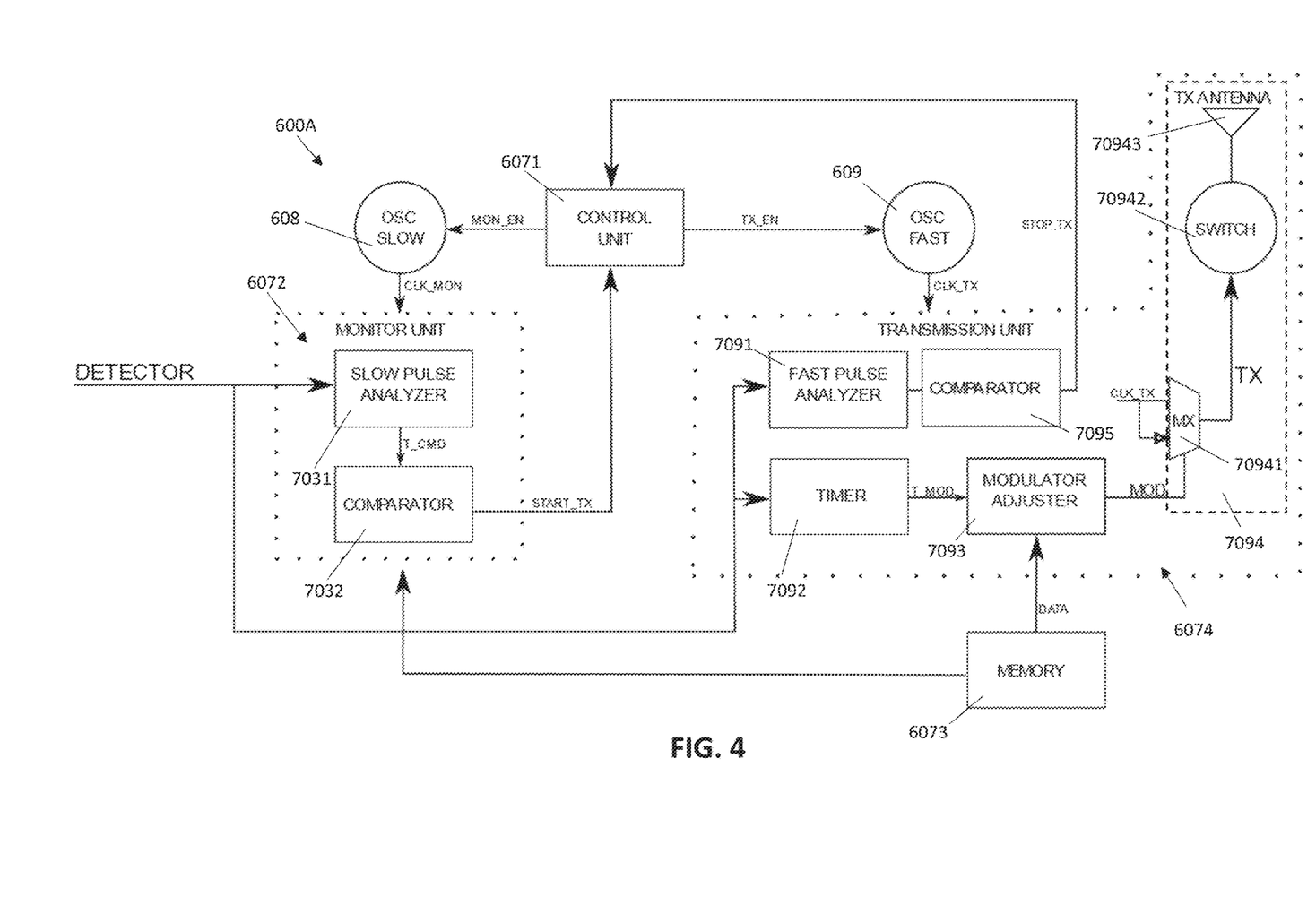
FIG. 4 schematically illustrates components of an electronic device according to the present invention.

FIGS. 3 and 4 show components of an embodiment of an electronic tag 600 for performing the methods shown in FIGS. 1A, 1B and 1C. In particular, the electronic tag is capable of receiving packets of the standard IEEE802 and more in particular packets of the standard IEEE802.11b, modifying part of the content of the packet and transmitting the modified packet. The electronic device has a support on which the components of FIGS. 3 and 4 are mounted.

As shown in FIG. 3, the electronic tag 600 comprises a receiving antenna 601 for receiving a first electromagnetic radiation, a second electromagnetic radiation and a third electromagnetic radiation. The electronic tag 600 comprises a harvesting unit 602 electrically connected to the receiving antenna 601 and to an energy storage 603, the energy storage 603 being a capacitor. The harvesting unit 602 may comprise a rectifier for rectifying 402 the first electromagnetic radiation received 401 at the receiving antenna 601 such that rectified energy is supplied to the energy storage 603 for being stored therein.

The electronic tag 600 comprises a digital processor 607 connected to the energy storage 603 via the power management unit 605. The digital processor 607 comprises a control unit 6071, a monitor unit 6072, a transmission unit 6074 and a memory 6073. The electronic tag 600 further comprises a slow clock 608 which clock rate is slower than the clock rate of a fast clock 609. The slow clock 608 has a frequency of 1 MHz. The fast clock has a frequency of 30 MHz. The frequency of both clocks may be adjustable.

Energy may be supplied from the energy storage 603 to the slow clock 608 and the fast clock 609. The slow clock 608 is connected to the monitor unit 6072 and to the control unit 6071. The fast clock 609 is connected to the transmission unit 6074 and to the control unit 6071. The monitor unit 6072 comprises a comparator 7032. The transmission unit 6074 comprises a modulator 7094. The memory 6073 may be a volatile memory, a non-volatile memory or a combination of a volatile memory and a non-volatile memory.

The modulator 7094 comprises a switch 70942 and a transmitting antenna 70943. The switch 70942 adjusts the impedance of the transmitting antenna 70943, in this way the amplitude of the transmitted fourth electromagnetic radiation may be adjusted.

The power management unit 605 may comprise a voltage limiter for limiting the maximum voltage that the energy storage 603 may reach. The power management unit 605 may comprise a voltage regulator for regulating the voltage of the electrical energy supplied to the digital processor 607, the demodulator/detector 604, the slow clock 608 and/or the fast clock 609. The voltage may be regulated by using parameters stored in the memory 6073.

In an initial state in which the voltage of the energy storage 603 is zero, meaning that there is not any energy stored in the energy storage 603, energy from a first electromagnetic radiation received 401 at the receiving antenna 601 is subsequently rectified 402 at the harvesting unit 602 and stored 403 in the energy storage 603. If in step 404 it is determined that the voltage of the energy storage 603 is not higher than a first predefined value, such as lower than the first predefined value or lower than a second predefined value which is lower than the first predefined value, the energy storage 603 keeps charging with energy from first electromagnetic radiations by performing steps 401, 402 and 403.

When the voltage of the energy storage 603 increases to a value higher than the first predefined value, which means that the energy storage 603 is sufficiently charged for performing the method of FIGS. 1A-1B and/or the method of FIGS. 1A-1C, the power management unit 605 determines 404 that the voltage of the energy storage 603 is higher than a first predefined value and supplies energy form the energy storage 603 to the digital processor 607, and to the demodulator/detector 604 keeping 405 the monitor unit 6072 and the demodulator/detector 604 in a switch on state and the transmission unit 6074 in a switch off state. Keeping the monitor unit 6072 and the demodulator/detector 604 in a switch on state involves supplying energy to the slow clock 608 such that clock cycles CLK_MON from the slow clock 608 are supplied to the demodulator/detector 604, to the monitor unit 6072 and more particularly to the comparator 7032. In particular, the slow clock 608 is activated by a signal mon_en sent by the control unit 6071. Keeping the transmission unit 6074 in a switch off state involves not supplying energy from the energy storage 603 to the transmission unit 6074 and more in particular to the modulator 7094.

The demodulator/detector 604 comprises a demodulator and an envelope detector. The envelope detector may have fixed sensitivity or a configurable sensitivity.

If the voltage of the energy storage 603 subsequently decreases below the second predefined value, the power management unit 605 stops supplying energy from the energy storage 603 to the monitor unit 6072, the control unit 6071 and the slow clock 608, returning to step 401 for charging the energy storage 603. Although this has not been shown in the figures for simplicity purposes, during all the steps of the methods illustrated in FIGS. 1A, 1B and 1C subsequent to step 404, the energy storage 603 keeps being charged by performing steps 401, 402 and 403.

While the monitor unit 6072 and the demodulator/detector 604 are kept in a switch on state and a second electromagnetic radiation having sufficient power is received at the receiving antenna 601, the second electromagnetic radiation is demodulated by the demodulator/detector 604 which detects the envelope of the second electromagnetic radiation. The result of the demodulation and envelope detection is sent to the slow pulse analyzer 7031. The slow pulse analyzer 7031 measures the duration of the pulses received from the demodulator/detector 604 and generates a first signal by using said durations. The first signal is sent to comparator 7032, which compares the first signal with identifiers of instructions stored in the memory 6073. If the comparator 7032 determines 408 that the first signal does not match any identifier of an instruction, steps 406 and 407 are repeated until a match in found.

If the comparator 7032 determines 408 that the first signal matches an identifier of a preestablished instruction, the monitor unit 6072 sends a START_TX signal to the control unit 6071. Reception of the signal START_TX triggers that the control unit 6071 changes 409 the configuration of the digital processor 607 from monitor mode to transmission mode.

Upon receiving the signal START_TX, the control unit 6071 deactivates 501A, 501B the monitor mode in the digital processor 607. In particular, the control unit 6071 causes that supply of energy from the energy storage 603 to the monitor unit 6072 is stopped. Upon receiving the signal START_TX, the control unit 6071 activates 502A, 502B the transmission mode in the digital processor 607. In particular, the control unit 6071 causes that energy is supplied from the energy storage 603 to the transmission unit 6074 and activates 502A, 502B the transmission mode in the digital processor 607 by supplying energy from the energy storage 603 to the transmission unit 6074 for keeping the transmission unit 6074 in a switch on state. More in particular, energy is supplied from the energy storage 603 to the modulator 7094 for keeping the modulator 7094 in a switch on state. Keeping the transmission unit 6074 in a switch on state involves supplying energy to the fast clock 609 such that clock cycles CLK_TX from the fast clock 609 are supplied to the modulator 7094. In particular, the fast clock 609 is activated by a TX_EN signal sent by the control unit 6071.

Upon receiving a third electromagnetic radiation at the receiving antenna 601, and more in particular upon detecting a rising edge of an envelope of a received third electromagnetic radiation, time measurement is started 503B by triggering a timer 7092. The timer 7092 causes a first time delay. The first time delay is for determining the first portion and the second portion of the third electromagnetic radiation. The first time delay can be set by the instruction having an identifier which matches the first signal.

The modulator 7094 comprises a multiplexer 70941, a switch 70942 and a transmitter 70943. At the same time as the third electromagnetic radiation is received at the receiving antenna 601, the third electromagnetic radiation is received at the transmitter 70943. The transmitter 70943 has an impedance which is adjusted by switch 70942. Multiplexer 70941 controls switch 70942 with signal TX. During the first portion of the third electromagnetic radiation, signal MOD is set to zero, and hence TX is CLK_TX. Thereby, the first portion of the third electromagnetic radiation is modulated together with CLK_TX at the same time as the third electromagnetic radiation is backscattered 504A, 504B at the transmitter 70943.

The third electromagnetic radiation received at the receiving antenna 601, is demodulated by the demodulator/detector 604 which detects the envelope of the third electromagnetic radiation. The result of the demodulation and envelope detection is sent to the fast pulse analyzer 7091. The fast pulse analyzer 7091 extracts the duration of pulses second timer 7091 causes a second time delay. The fast pulse analyzer 7091 measures the duration of the pulses received from the demodulator/detector 604 and generates a signal by using said durations. The signal is sent to comparator 7095, which compares the signal with an identifier of a stop instruction stored in the memory 6073. If the comparator 7095 determines 505A, 505B that the signal matches an identifier of a stop instruction, a STOP_TX instruction is sent to the control unit 6071. In response, the control unit 6071 deactivates the transmission mode in the digital block and activates the monitor mode in the digital block, hence returning to step 405.

Otherwise, if the comparator 7095 determines 505A, 505B that the signal does not match an identifier of a stop instruction, it is determined 506A, 506B whether the first time delay has been reached. If the first time delay has not been reached, step 504 keeps being performed.

The first modulation is an AM modulation. More in particular, the first modulation generates two lateral bands separated by the central frequency of the received IEEE802.1 packet so that interference between the received third electromagnetic radiation and the transmitted fourth electromagnetic radiation is minimized.

When the timer 7092 reaches the end of the time delay it means that a time higher than the threshold has been reached 506A, 506B and hence the first portion of the third electromagnetic radiation reaches its end. Then, the timer 7092 sends a T_MOD signal to the modulator adjuster 7093, and hence the second portion of the third electromagnetic radiation is modulated with a second modulation. The execution of the second modulation algorithm relies on data of the memory 6073 for adjusting a parameter of the second modulation. In particular, in the present embodiment, the modulator adjuster 7093 adjusts MOD signal for controlling the output signal TX of multiplexer MX to the inverse of CLK_TX signal. Thereby, the impedance of transmitter 70943 is adjusted by adjusting TX signal and hence it is caused a change of the data backscattered at transmitter 70943. In this way, data contained in the second portion of the third electromagnetic radiation can be adjusted to contain data od identification of the stored in memory 6073.

As shown in FIG. 1C, step 509B can be performed instead of step 509A. This means that instead of inserting data of identification of the electronic tag 600 into the fourth electromagnetic radiation, other data contained in the memory 6073 can be inserted. For example, data instructed by the instruction which identifier matches the first signal.

Unlike the first modulation, the second modulation comprises a BPSK modulation through which data contained in the memory 6073 is inserted in the modulated electromagnetic radiation.

Figure 5:
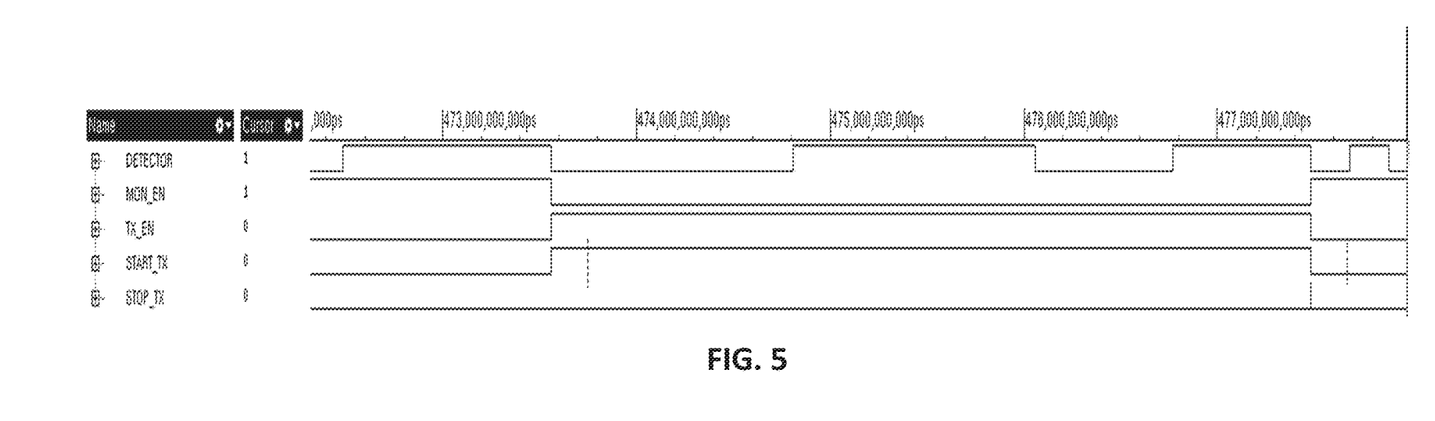
FIG. 5 is a digital timing diagram showing signals of an electronic device according to the present invention.
Figure 6:
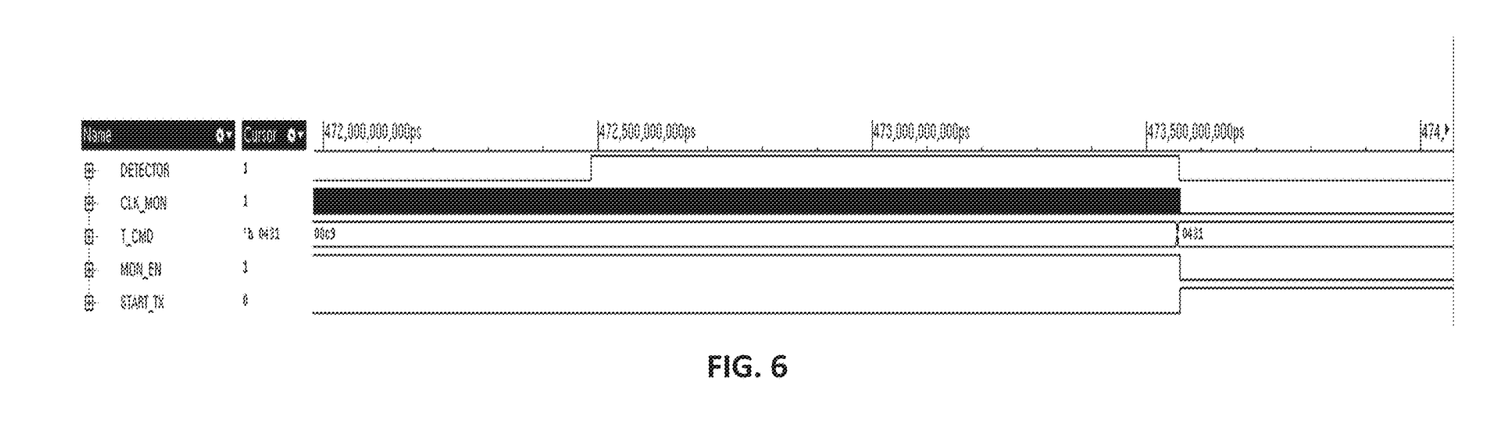
FIG. 6 is a digital timing diagram showing signals of an electronic device according to the present invention.

FIGS. 5 and 6 illustrate a change between the monitor mode of the digital processor 607 and the transmission mode of the digital processor 607. At moment 51 a change from low to high takes place in signal START_TX sent by the comparator 7032 to the control unit 6071, causing start of the transmission mode of the digital processor 607. At moment 51 a change from low to high takes place in TX_EN signal sent by the control unit 6071 to the fast clock 609 so that clock cycles CLK_TX are sent by the fast clock 609 to the transmission unit 6074. At moment 51 signal mon_en, which is sent to the slow clock 608, changes from high to low, deactivating the monitor mode. At moment 52 STOP_TX signal is sent, deactivating the transmission mode of the digital processor 607 and activating the monitor mode of the digital processor. Thereby, upon receiving the STOP_TX signal, the control unit 6071 changes signal mon_en sent to the slow clock 608 from low to high and changes TX_EN signal sent to the fast clock 609 from high to low.

Figure 7:
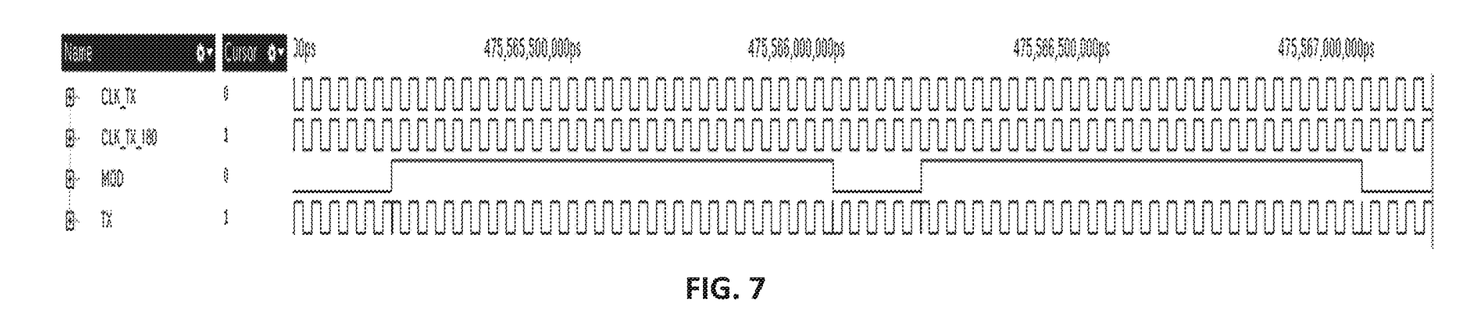
FIG. 7 is a digital timing diagram showing signals of an electronic device according to the present invention.

FIG. 7 illustrates how TX signal sent to switch 70942 is adjusted by adjusting MOD signal sent from the modulator adjuster 7093 to the multiplexer 70941. Multiplexer 70941 receives CLK_TX, CLK_TX 180 and MOD signals and outputs one of signals CLK_TX and CLK_TX 180 depending on the value of signal mod. As shown in FIG. 7, signal CLK_TX 180 takes a logic value which is the opposite of signal CLK_TX at any time. Upon changing MOD signal from low to high and viceversa, signal TX changes from being equal to CLK_TX 180 to being equal to CLK_TX or viceversa.

Figure 8:
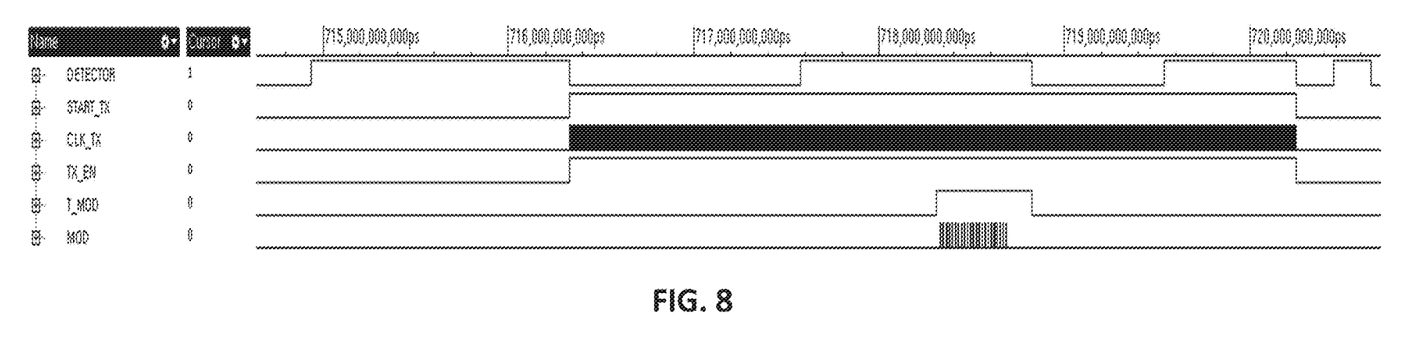
FIG. 8 is a digital timing diagram showing signals of an electronic device according to the present invention.

FIG. 8 shows how the data modulator works for modulating the second portion of the third electromagnetic radiation. At the beginning of the second portion of the third electromagnetic radiation, T_MOD signal changes from low to high, which activates the modulator adjuster 7093. The modulator adjuster 7093 starts modulating the second portion of the third electromagnetic radiation by using data contained in the memory 6073. Depending on this data, the modulator adjuster 7093 outputs MOD signal of a particular value for adjusting the data contained in the modulated radiation to the target value.

Figure 2:
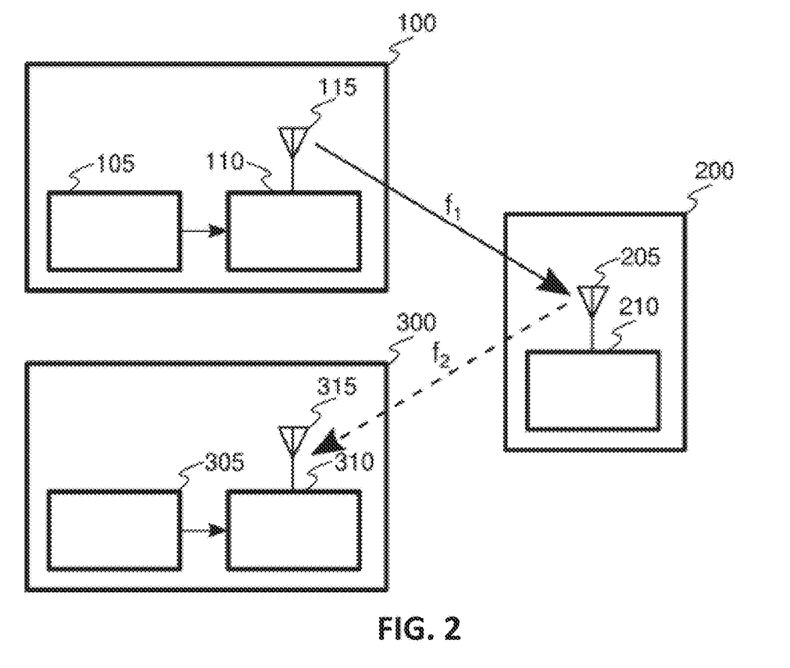
FIG. 2 schematically illustrates a communication with an electronic device according to the present invention.

FIG. 2 schematically illustrates communication between an electronic tag 200 according to the present invention and two electronic devices 100, 300 external to the electronic tag 200. The first external electronic device 100 has a transmitting antenna 115 connected to a radio wifi 110, the radio wifi 110 being connected to a microprocessor 105. The second external electronic device 300 has a transmitting antenna 315 connected to a radio wifi 310, the radio wifi 310 being connected to a microprocessor 305. The electronic tag 200 is an electronic device according to the second or third aspect of the invention and comprises a transmitting and receiving antenna 205. FIG. 2 illustrates how a third electromagnetic radiation f1 is sent from a first external electronic device 100 to the electronic tag 200. The electronic tag 200 processes the third electromagnetic radiation through a method as shown in FIGS. 1A, 1B and 1C, resulting in a fourth electromagnetic radiation f2 which is sent from the electronic tag 200 to the second external device 300.

In this text, the term "comprises" and its derivations (such as "comprising", etc.) should not be understood in an excluding sense, that is, these terms should not be interpreted as excluding the possibility that what is described and defined may include further elements, steps, etc.

On the other hand, the invention is obviously not limited to the specific embodiment(s) described herein, but also encompasses any variations that may be considered by any person skilled in the art (for example, as regards the choice of materials, dimensions, components, configuration, etc.), within the general scope of the invention as defined in the claims.

What is claimed is:

1. A method for wirelessly receiving and transmitting electromagnetic radiation, the method comprising:
    wirelessly receiving a first electromagnetic radiation;
    storing energy of the received first electromagnetic radiation in an energy storage;
    determining whether a parameter indicative of the energy stored in the energy storage indicates that the energy stored in the energy storage is higher than a first predefined value or lower than a second predefined value, wherein the second predefined value is lower or equal to the first predefined value;
    if the parameter indicates that the energy stored in the energy storage is higher than the first predefined value, supplying energy from the energy storage:
        to a demodulator and a comparator such that the demodulator and the comparator are in a switch on state, or
        to a modulator and a transmitter such that the modulator and the transmitter are in a switch on state;
    if the parameter indicates that the energy stored in the energy storage is lower than the second predefined value, limiting the supply of energy from the energy storage to the demodulator and the modulator such that the demodulator and the modulator are in a switch off state;
    wirelessly receiving a second electromagnetic radiation;

if the demodulator is in a switch on state, demodulating the second electromagnetic radiation so that a first signal is generated, wherein the demodulating step is performed by the demodulator;

if the comparator is in a switch on state, comparing the first signal with a set of signals, wherein the comparing step is performed by the comparator;

wirelessly receiving a third electromagnetic radiation;

if the modulator is in a switch on state, modulating the received third electromagnetic radiation into a fourth electromagnetic radiation if the first signal matches a signal of the set of signals; wherein the modulating step is performed by the modulator and comprises:

modulating a first portion of the third electromagnetic radiation into the fourth electromagnetic radiation using a first modulation;

modulating a second portion of the third electromagnetic radiation into the fourth electromagnetic radiation using a second modulation different from the first modulation, thereby modifying data contained in the second portion of the third electromagnetic radiation;

if the transmitter is in a switch on state, wirelessly transmitting the fourth electromagnetic radiation, wherein the wireless transmitting step is performed by the transmitter.

2. The method of claim 1, wherein the second portion of the third electromagnetic radiation is determined by using the matched signal or wherein a parameter of the second modulation depends on the matched signal.

3. The method of claim 1, wherein the first electromagnetic radiation has a frequency of 2.45 GHz or higher.

4. The method of claim 1, wherein the first electromagnetic radiation is a packet of protocol IEEE 802.

5. The method of claim 1, wherein the demodulating step is performed at a first clock rate, and the modulating step is performed at a second clock rate; wherein the first clock rate is lower than the second clock rate.

6. The method of claim 1, wherein the modulation causes a change in the frequency of the radiation.

7. The method of claim 1, wherein the third electromagnetic radiation is a packet of protocol IEEE 802 having a header and a payload; wherein the header forms part of the first portion of the third electromagnetic radiation and wherein the payload forms part of the second portion of the third electromagnetic radiation.

8. The method of claim 1, wherein the step of demodulating the second electromagnetic radiation is performed only if the power of the second electromagnetic radiation is higher than a third predefined value.

9. The method of claim 8, wherein the third predefined value is adjustable within a range of at least −40 dBm and at most −10 dBm.

10. The method of claim 1, wherein the third electromagnetic radiation is modulated into the fourth electromagnetic radiation by adjusting a reflection of the third electromagnetic radiation.

11. The method of claim 10, wherein the reflection of the third electromagnetic radiation is adjusted by adjusting an impedance of a wireless receiver performing the step of wirelessly receiving the third electromagnetic radiation.

12. The method of claim 1, wherein:

if the parameter indicative of the energy stored in the energy storage indicates that the energy stored in the energy storage is higher than the first predefined value and the first signal matches a signal of the set of signals, supplying energy from the energy storage to the modulator and the transmitter such that the modulator and the transmitter are in a switch on state, and limiting supply of energy from the energy storage to the comparator such that the comparator is in a switch off state;

if the parameter indicative of the energy stored in the energy storage indicates that the energy stored in the energy storage is higher than the first predefined value and the first signal does not match any signal of the set of signals, supplying energy from the energy storage to the demodulator and the comparator such that the demodulator and the comparator are in a switch on state, and limiting supply of energy from the energy storage to the modulator and/or the transmitter such that the modulator and/or the transmitter is/are in a switch off state.

13. An electronic device for wirelessly receiving and transmitting electromagnetic radiation, the electronic device comprising:

a receiver for receiving a first electromagnetic radiation;

an energy storage configured for storing energy of the received first electromagnetic radiation;

a demodulator configured for demodulating a second electromagnetic radiation wirelessly received by the electronic device so that a first signal is generated;

a comparator configured for comparing the first signal with a set of signals;

a measuring entity configured for defining a second portion of a third electromagnetic radiation wirelessly received;

a modulator;

a transmitter for transmitting a fourth electromagnetic radiation;

a data storage; and energy supply means configured for supplying energy from the energy storage:

to the demodulator and the comparator such that the demodulator and the comparator are in a switch on state, or to the modulator and the transmitter such that the modulator and the transmitter are in a switch on state if a parameter indicative of the energy stored in the energy storage indicates that the energy stored in the energy storage is higher than a first predefined value;

the energy supply means being further configured for: if the parameter indicates that the energy stored in the energy storage is lower than a second predefined value lower or equal to the first predefined value, limiting the supply of energy from the energy storage to the demodulator and the modulator such that the demodulator and the modulator are in a switch off state;

the demodulator being configured for demodulating the second electromagnetic radiation if the demodulator is in a switch on state;

the comparator being configured for comparing the first signal with a set of signals if the comparator is in a switch on state;

the modulator being configured for modulating the received third electromagnetic radiation into the fourth electromagnetic radiation if the first signal matches a signal of the set of signals and the modulator is in a switch on state; wherein the modulator is configured for performing the modulation by:

modulating a first portion of the third electromagnetic radiation into the fourth electromagnetic radiation using a first modulation, and modulating the second portion of the third electromagnetic radiation into the fourth electromagnetic radiation using a second modulation different from the first modulation, thereby modifying data contained in the second portion of the third electromagnetic radiation.

14. The electronic device of claim 13, wherein the device is an electronic tag.

15. An electronic device comprising:
    a wireless transceiver for receiving and transmitting electromagnetic radiations;
    an energy storage for storing energy of a received electromagnetic radiation;
    a data storage; and
    processing means configured a method having the following steps:
    wirelessly receiving a first electromagnetic radiation;
    storing energy of the received first electromagnetic radiation in an energy storage;
    determining whether a parameter indicative of the energy stored in the energy storage indicates that the energy stored in the energy storage is higher than a first predefined value or lower than a second predefined value, wherein the second predefined value is lower or equal to the first predefined value;
    if the parameter indicates that the energy stored in the energy storage is higher than the first predefined value, supplying energy from the energy storage:
    to a demodulator and a comparator such that the demodulator and the comparator are in a switch on state, or
    to a modulator and a transmitter such that the modulator and the transmitter are in a switch on state;
    if the parameter indicates that the energy stored in the energy storage is lower than the second predefined value, limiting the supply of energy from the energy storage to the demodulator and the modulator such that the demodulator and the modulator are in a switch off state;
    wirelessly receiving a second electromagnetic radiation;
    if the demodulator is in a switch on state, demodulating the second electromagnetic radiation so that a first signal is generated, wherein the demodulating step is performed by the demodulator;
    if the comparator is in a switch on state, comparing the first signal with a set of signals, wherein the comparing step is performed by the comparator;
    wirelessly receiving a third electromagnetic radiation;
    if the modulator is in a switch on state, modulating the received third electromagnetic radiation into a fourth electromagnetic radiation if the first signal matches a signal of the set of signals; wherein the modulating step is performed by the modulator and comprises:
    modulating a first portion of the third electromagnetic radiation into the fourth electromagnetic radiation using a first modulation;
    modulating a second portion of the third electromagnetic radiation into the fourth electromagnetic radiation using a second modulation different from the first modulation, thereby modifying data contained in the second portion of the third electromagnetic radiation;
    if the transmitter is in a switch on state, wirelessly transmitting the fourth electromagnetic radiation, wherein the wireless transmitting step is performed by the transmitter.

16. The electronic device of claim 15, wherein the device is an electronic tag.

* * * * *